United States Patent [19]

Pogge

[11] 4,256,514
[45] Mar. 17, 1981

[54] METHOD FOR FORMING A NARROW DIMENSIONED REGION ON A BODY

[75] Inventor: Hans B. Pogge, Hopewell Junction, N.Y.

[73] Assignee: International Business Machines Corporation, Armonk, N.Y.

[21] Appl. No.: 957,604

[22] Filed: Nov. 3, 1978

[51] Int. Cl.$^3$ .................. H01L 21/22; H01L 21/26; H01L 21/285; H01L 21/308
[52] U.S. Cl. ..................... 148/1.5; 29/576 B; 29/578; 29/580; 148/187; 156/643; 156/657; 156/662; 428/88; 428/95
[58] Field of Search ........... 156/643, 657, 662; 204/192 E; 148/187, 1.5; 357/36, 48, 47; 428/88, 95; 29/576 B, 578, 580

[56] References Cited

U.S. PATENT DOCUMENTS

| | | | |
|---|---|---|---|
| 3,488,564 | 1/1970 | Crafts | 357/36 |
| 3,591,840 | 7/1971 | Glinski | 357/47 |
| 3,670,403 | 6/1972 | Lawrence et al. | 156/657 |
| 3,966,577 | 6/1976 | Hochberg | 204/192 E |
| 3,971,684 | 7/1976 | Muto | 204/192 E |
| 4,042,726 | 8/1977 | Kaji et al. | 156/657 |
| 4,093,503 | 6/1978 | Harris | 156/643 |
| 4,104,086 | 8/1978 | Bondur | 156/643 |
| 4,104,090 | 8/1978 | Pogge | 156/657 |

OTHER PUBLICATIONS

Abbas et al., "Extending . . . Processing", *IBM Technical Disclosure Bulletin*, vol. 20, No. 4 (9/77), pp. 1376-1378.
Pogge, "Narrow Wire . . . Method", *IBM Technical Disclosure Bulletin*, vol. 6 (11/76), p. 2354.
Bersin, "A Survey . . . Processes", *Solid State Technology*, (5/76), pp. 31-36.
Critchlow, "High Speed . . . Lithography", vol. 9, No. 2 (2/76), pp. 33-37.
Gdula et al., "CCD . . . Polysilicon", *IBM Technical Disclosure Bulletin*, vol. 21, No. 5 (10/78), pp. 1865-1866.
Chang et al., "Transistor . . . Metal", *IBM Technical Disclosure Bulletin*, vol. 21, No. 2 (7/78), pp. 578-579.
Deines et al., "Process . . . Geometries", *IBM Technical Disclosure Bulletin*, vol. 21, No. 9 (2/79), pp. 3628-3629.

*Primary Examiner*—Jerome W. Massie
*Attorney, Agent, or Firm*—George O. Saile

[57] ABSTRACT

A method for forming a narrow dimensioned, for example, submicron, region on a silicon body that involves forming on the silicon body regions having substantially horizontal surfaces and substantially vertical surfaces. A layer of a very narrow dimension is formed both on the substantially horizontal and substantially vertical surfaces. Reactive ion etching is applied to the layer to substantially remove the horizontal layer while leaving the vertical layer substantially intact. The vertical layer dimension is adjusted depending upon the original thickness of the layer applied.

19 Claims, 31 Drawing Figures

METHOD FOR FORMING A NARROW DIMENSIONED REGION ON A BODY

DESCRIPTION

Technical Field

This invention relates to methods for forming highly dense and very small, integrated semiconductor devices, and more particularly to forming a narrow dimensioned region in the submicron size on a silicon body.

CROSS-REFERENCES TO RELATED APPLICATIONS (1) Patent application Ser. No. 957,606 filed Nov. 3, 1978 entitled, "Method for Forming An Insulator Between Layers of Conductive Material" by J. Riseman.

(2) Patent application Ser. No. 957,605 filed Nov. 3, 1978 entitled, "Method for Forming A Narrow Dimensioned Mask", by I. T. Ho and J. Riseman.

(3) Patent application Ser. No. 957,599 filed Nov. 3, 1978 entitled, "Method for Forming Diffusions Through Narrow Dimensioned Openings Into A Body", by I. T. Ho and J. Riseman.

BACKGROUND ART

There has been a dramatic increase in the complexity of silicon integrated circuits over the past ten years. As applications develop for microprocesses and minicomputers there is an increasing demand for greater complexities, higher switching speeds, and smaller devices in the integrated circuit. The major technology in the semiconductor process which allows this increase complexity of integrated circuits is the lithographic technology. Over the past few years only modest reductions in line widths were achieved. It has been the photolithographic defect level reductions which have allowed the high levels of integration to be achieved. There has been a gradual decrease in line widths from about 5 to 10 micrometers to about 3 to 5 micrometers at the present time. Light has been used almost exclusively until the present time in the lithographic process. However, optical resolution limits make further advances much more difficult. The thrust today is to non-light lithography, and in particular to electron beam and X-ray exposure processes to achieve the higher packing densities required for the future. These problems and their possible solutions are discussed in greater detail by B. L. Critchlow in the publication entitled, "High Speed MOSFET circuits Using Advanced Lithography", published in the Computer, Volume 9, No. 2, February 1976, pages 31 through 37. In that publication the substantial equipment cost and complexities of X-ray and electron beam lithography are described. However, up until now it has been believed that these were the only alternatives to optical projection printing for high complexity integrated circuit devices of the future.

There have been other efforts to obtain narrow line widths in the range of 1 micrometer or less by extending standard photolithography techniques and avoiding the need to use the more expensive and complex techniques such as electron beam or X-ray lithography. One such technique is described by H. B. Pogge in IBM Technical Disclosure Bulletin, November 1976, Volume No. 6, entitled "Narrow Line Widths Masking Method." This method involves the use of a porous silicon followed by oxidation of the porous silicon. Another technique is described by S. A. Abbas, et al, IBM Technical Disclosure Bulletin, Volume 20, No. 4, September 1977, pages 1376 through 1378. This TDB describes the use of polycrystalline silicon masking layers which are made into masks by first using an intermediate mask of oxidation blocking material, such as silicon nitride in the formation of the polycrystalline silicon. Line dimensions below about 2 micrometers may be obtained by this technique.

Plasma or reactive ion etching is a technique which has been developed for etching metals, semiconductor materials and dielectrics in the manufacture of integrated circuit devices. In particular, the method of reactive ion etching which is capable of doing anisotropic etching wherein very high aspect ratios can be obtained, that is the ratio of vertical etching is much greater than the horizontal etching. The process involves the use of a plasma or ionized gas containing a variety of highly reactive particles such as ions, free electrons and free radicals. The plasmas used in etching may be maintained at relatively low temperatures of the order up to 250° C. and low pressures in the range of 0.005 to 20 torr. The particles in the plasma are largely free radicals which cause the plasma's intense reactivity. The ion population in low temperature plasma is of the order of one percent of the particles. "A Survey of Plasma-Etching Processes" by Richard L. Bersin published in Solid State Technology, May 1976, pages 31 through 36 in great detail describe the plasma etching process and its application to semiconductor materials. The process has been used to make trenches or openings in silicon semiconductor bodies of various patterns as shown by Arthur K. Hochberg, U.S. Pat. No. 3,966,577 issued June 29, 1976; J. A. Bondur, U.S. Pat. No. 4,104,086, and assigned to the assignee of the present patent application and J. A. Bondur, et al, U.S. Pat. No. 4,139,442, and assigned to the assignee of the present patent application. Further information about the process for reactive ion or plasma etching may be more fully understood by reference to the J. N. Harvilchuck, et al, patent application Ser. No. 594,413 filed July 9, 1975 now abandoned, and continuation patent application Ser. No. 822,775 filed Aug. 8, 1977, now abandoned. The RF induced plasma in the Harvilchuck, et al patent application is reactive chlorine, bromine or iodine specie. A precise description of the RF discharge apparatus and the processing is given in detail in that patent application.

It is the object of the invention to extend the use of conventional lithography techniques to line widths in the submicrometer range by utilizing the plasma or reactive ion etching process.

SUMMARY OF THE PRESENT INVENTION

In accordance with the present invention, a method for forming a narrow dimension region on a silicon body is described wherein regions are formed on the silicon body having substantially horizontal surfaces and substantially vertical surfaces. A layer is then formed on both the substantially horizontal surface and the substantially vertical surface of the desired thickness of the narrow dimensioned region. Reactive ion or plasma etching is used to substantially remove the horizontal layer while not significantly effecting the vertical layer. This process then results in a narrow dimensioned region on the vertical surfaces of the silicon body with the horizontal surfaces free of the layer. The structure can be used for various purposes, one of which would be where the layer is an insulator and the horizontal regions are opened to the silicon body and a thermal diffusion or ion implantation of impurities may be accomplished through this narrow dimensioned region into the silicon body.

The silicon body regions having substantially horizontal surfaces and substantially vertical surfaces may be formed in one of two ways. One formation technique would be to deposit a layer of insulator material, polycrystalline silicon material or similar material on the surface of a silicon body and then etching openings in this layer down to substantially the silicon body. A second alternative is the use of etching to form trenches, grooves or depressions in the silicon body itself. The structure can be used as a submicrometer diffusion mask into the silicon body at the surface or at the bottom of the trenches or grooves.

In the alternative where trenches or grooves are formed and a vertical narrow dimensioned insulating layer is formed on the vertical walls of the trenches or grooves, polycrystalline silicon can be chemically vapor deposited to fill the grooves and make electrical contact to the substrate at the bottom of the trench or groove.

Another modification of this technique involves making dielectric isolation between monocrystalline regions in the manufacture of bipolar high density integrated circuits. In this alternative the depressions or grooves in the silicon body are formed with two different widths. The chemical vapor deposition, for example, of an insulating layer on this surface will cause filling of the narrowest width depressions and forms a layer on the remaining widest depressions having substantially horizontal surfaces and the substantially vertical surfaces. Reactive ion etching of the layer results in the substantial removal of the horizontal layer and provides a narrow dimensioned region in the widest of the depressions in which the silicon body is exposed. A conductive layer is deposited over the insulating layer and the exposed silicon in the widest of the depressions. The conductive layer makes electrical contacts to the substrate at the exposed silicon in the bottom of the widest depressions.

DISCLOSURE OF THE INVENTION

Figure 1A:
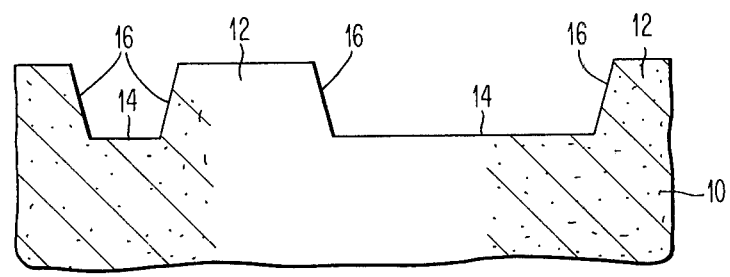
FIGS. 1A, 1B, 1C show the basic process of the present invention.
Figure 1B:
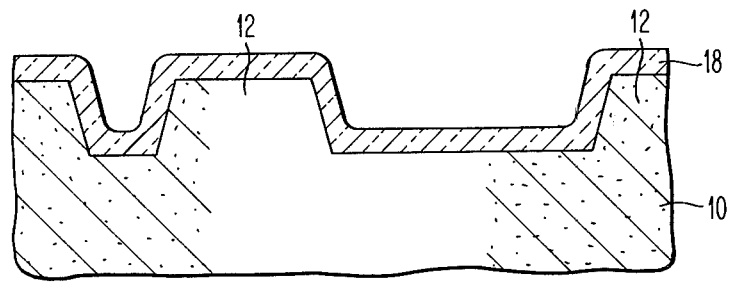
Figure 1C:
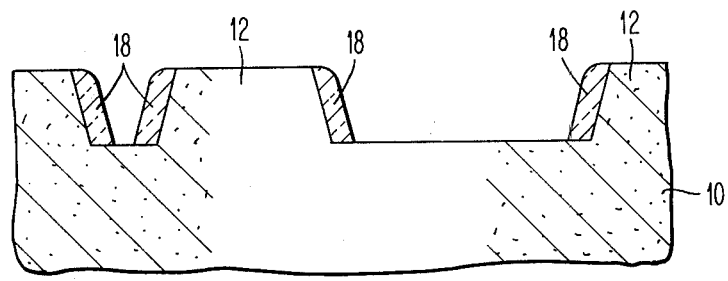

Referring now more particularly to FIGS. 1A through 1C the basic manufacturing steps for one basic form of the invention is described. FIG. 1A illustrates one small, greatly enlarged portion of a silicon body which will be used to form a very dense integrated circuit. A silicon body 10 is provided and regions 12 having substantially a horizontal surface 14 and substantially a vertical surface 16 are formed in the silicon body. The regions having the horizontal and vertical surfaces may be alternatively formed by etching of trenches, grooves, openings or depressions in the silicon body 10 itself, or forming a layer on the surface of a silicon body which may be an insulating layer, polycrystalline silicon layer or similar material and then making openings in the layer down to the silicon body itself. The vertical surfaces 16 must be substantially vertical and equal to or less than about 5° from the vertical so as to have an operative subsequent reactive ion etching process. A layer 18 is formed on both the horizontal surfaces 14 and the substantially vertical surfaces 16. This layer may have a range of thicknesses of between about 500 Å to 20,000 Angstroms, the exact thickness depending on the specific use in subsequent processing and application. The layer 18 may be composed of a variety of materials or combination of materials which include silicon dioxide, silicon nitride, aluminum oxide, polycrystalline silicon, and the like.

The FIG. 1B is now ready for the plasma or reactive ion etching process. This process may be more fully understood by reference to the J. M. Harvilchuck patent applications referred to above. The RF induced plasma is preferably a reactive chlorine specie as specified in the Harvilchuck patent application and in the Bondur, et al patents referred to above. The precise description of the RF glow discharge apparatus is given in the beforementioned Havlichuck, et al patent applications. The reactive ion or plasma ambient is preferably a combination of the chlorine species with an inert gas such as argon. Application of suitable power in the order of about 0.1 to 0.50 watts/cm$^2$ from an RF voltage source will produce sufficient power density to cause the reactive ion etching operation of the insulator to be carried out at a rate of about 0.01 to 0.5 micrometers/minute. The desired result of the etching is shown in FIG. 1C wherein the layer is substantially or completely removed from the horizontal surfaces 14. There is substantially no effect on the layer 18 which is present on the vertical surfaces 16. The result then is a narrow dimensioned region 18 on the vertical surfaces 16 of the structure as shown in FIG. 1C. The structure is now ready for other semiconductor processing steps such as a diffusion operation, an ion implantation process or a deposition of insulator or conductive films thereover.

Figure 2A:
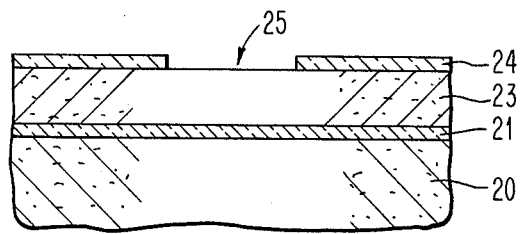
FIGS. 2A through 2E show a method for forming a submicrometer lithography line width according to the process of the present invention.
Figure 2B:
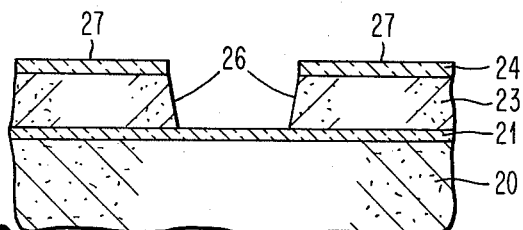

FIGS. 2A through 2E illustrate a second embodiment of a method for submicrometer lithography line widths. FIG. 2A illustrates one small, greatly enlarged portion of a silicon body 20 with a first insulating layer 21 and polycrystalline silicon 23 deposited thereover. The first insulating layer may be any one or a combination of known insulating materials such as silicon dioxide, silicon nitride, aluminum oxide, or the like. Methods for depositing layers of silicon dioxide include thermally growing silicon dioxide in an oxygen or oxygen-water vapor ambient at a temperature of about 970° C. A second method for growing silicon dioxide involves the use of a chemical vapor deposition wherein the silicon dioxide is deposited from a gas mixture of $SiH_4/O_2$, $SiH_4/N_2O$, $SiH_4/CO_2$ or $SiCl_2H_2/N_2O$ in a temperature range of 400° C.–1000° C. under either atmospheric or low pressure conditions. The deposition of silicon nitride is usually formed by chemically vapored deposition using the following process conditions: SiH$_4$/NH$_3$ at temperatures greater than 500° C. under atmospheric or low pressure conditions. The deposition of polycrystalline silicon may be by chemical vapored deposition utilizing the following conditions: SiH$_4$ in the temperature range of 500°–1000° C. under atmospheric or low pressure conditions. A masking layer, such as a silicon dioxide layer 24, is formed on the surface of the polycrystalline silicon 23 by means of either the thermal deposition process or the chemical deposition process described above. The thickness of the silicon dioxide mask is typically 2000 to 20,000 Å. Standard photolighography and etching techniques may be utilized to make opening 25 in the silicon dioxide layer 24. This opening may have a line width of between about 2.0 to 4.0 micrometers. The FIG. 2A structure is placed in a reactive ion or plasma etching environment for polycrystalline silicon having typically the conditions as follows: Cl$_2$/Ar gas mixture, 0.16 watts/cm$^2$ power density, 10 micrometers pressure, SiO$_2$ cathode, 10 cc/min. flow rate, and using the apparatus described in the Harvilchuck, et al patent application mentioned above. The reactive ion etching process is completed when the layer 21 is reached and the resulting structure is shown in FIG. 2B wherein a depression, groove or trench is formed in polycrystalline silicon layer 23. The trench has substantially vertical sides 26. The body shown in FIG. 2B also has horizontal surfaces 27. A second insulating layer 28 is then formed typically by chemical vapor deposition on both the substantially horizontal surfaces 27 and the substantially vertical surfaces 26. This insulating layer may be one of several insulating materials such as silicon dioxide, silicon nitride, aluminum oxide and combinations of these materials, or the like.

Figure 2C:
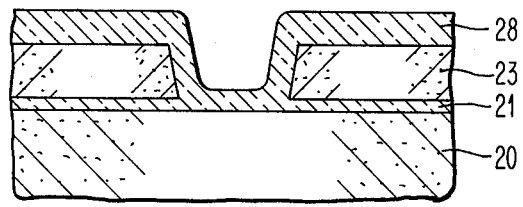
Figure 2D:
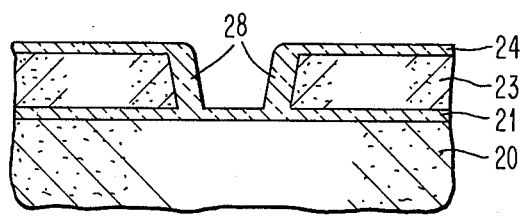
Figure 2E:
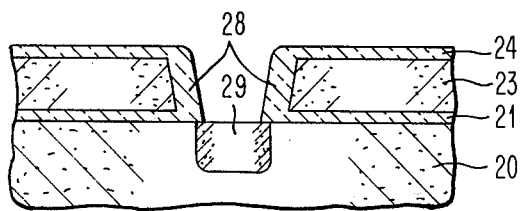

The FIG. 2C structure is placed into a suitable reactive ion etching ambient wherein the layer 28 may be etched. The ambient depends upon the particular composition of layer 28. The reactive ion etching process substantially removes the horizontal portion of layer 28 and provides the narrow dimensioned vertical region on the silicon body which is shown in FIG. 2D. The silicon dioxide layer 24 substantially remains during this process. The first insulating layer 21 which is shown may then be removed by reactive ion etching process using a suitable ambient for that purpose. The result of this removal is the structure of FIG. 2E. Alternatively, layer 21 could be removed with a continuation of etching when layer 28 is removed, resulting in FIG. 2E. It should be noted that the opening of FIG. 2E is substantially less than the opening 25 shown in FIG. 2A. The process thus forms a submicrometer opening which may be used for diffusion, ion implantation or an electrical contact hole. A diffused region 29 is illustrated in FIG. 2E.

Figure 3A:
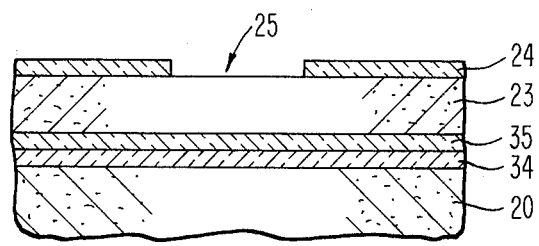
FIGS. 3A through 3D show the formation of a submicrometer lithography diffusion mask in another embodiment of the present invention.
Figure 3B:
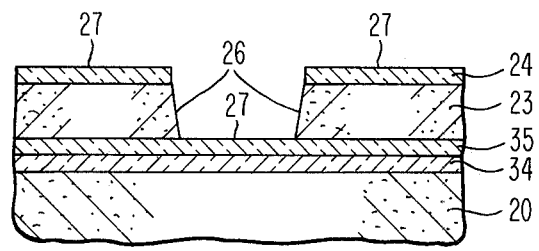
Figure 3C:
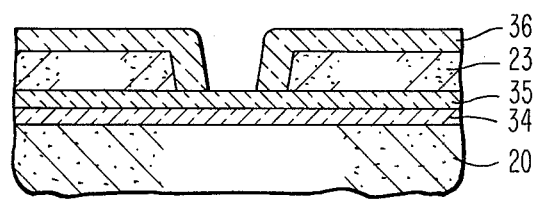
Figure 3D:
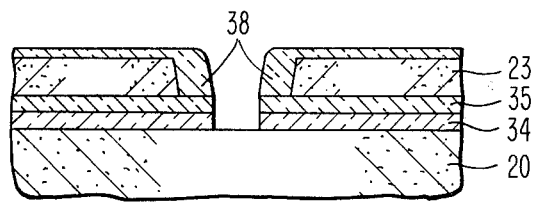

The FIGS. 3A through 3D shows a third embodiment of the present invention. This embodiment is similar to that of the second embodiment shown in FIGS. 2A through 2E, and like numbers would indicate like structures. The first insulating layer in the present embodiment is composed of two layers, silicon dioxide layer 34 and silicon nitride layer 35 deposited in that order on silicon body 20. A polycrystalline silicon layer 23 is deposited thereover. A silicon dioxide mask 24 is formed by depositing the silicon dioxide layer 24 followed by standard photolithography and etching techniques to form opening 25 in the area desired. Reactive ion etching is utilized as described in the second embodiment to form the opening in the structure as shown in FIG. 3B having substantially a horizontal surface 27 and substantially a vertical surface 26. The 3B structure is placed in an oxidizing ambient such as water-vapor at 970° C. and thermally grown silicon dioxide layer 36 over the surfaces as the second insulating layer. It should be noted that a part of the polycrystalline layer 23 is consumed by this thermal oxidation process. The reactive ion etching step is utilized to substantially remove the horizontal silicon dioxide layer 36 layer and to provide the narrow dimensioned region 38 on the silicon body. The silicon dioxide layer 34 and silicon nitride layer 35 are then removed by standard etching or reactive ion etching techniques. The FIG. 3D structure is now ready for the submicrometer line width diffusion, ion implantation, or electrical contact processing steps as desired.

Figure 4A:
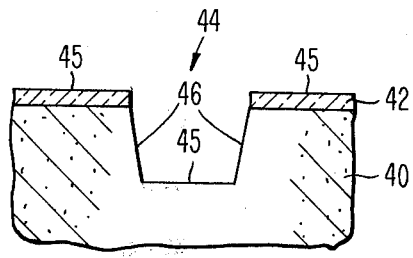
FIGS. 4A through 4F illustrate the process for the formation of a diffusion mask in trenches or grooves in another embodiment of the present invention.
Figure 4B:
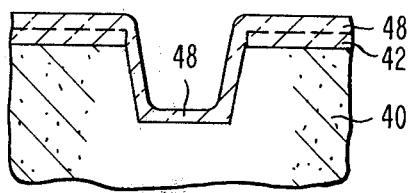
Figure 4C:
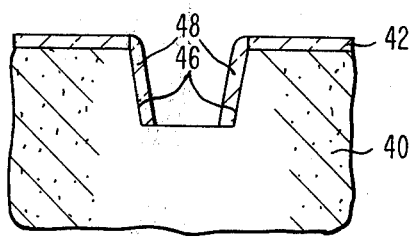
Figure 4D:
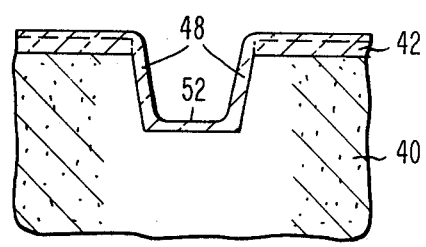
Figure 4E:
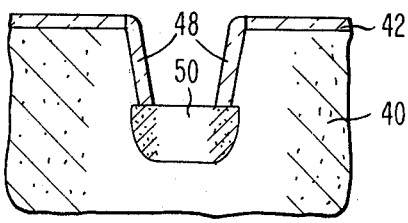
Figure 4F:
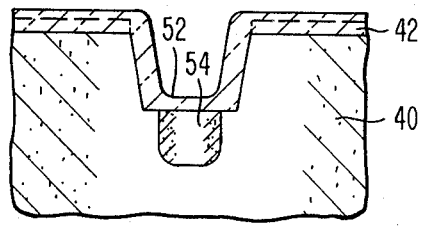

FIGS. 4A through 4F show a fourth embodiment of the present invention wherein a submicrometer diffusion mask is formed in a trench, groove or depression in the silicon body itself. FIG. 4A shows a silicon body 40 having a silicon dioxide mask 42 on its surface. The silicon dioxide may be formed by thermal heating techniques in an oxidizing atmosphere or by chemical vapor deposition. The mask opening in the silicon dioxide layer 42 is formed by standard photolithography and etching techniques. Reactive ion etching of silicon is then performed by the process described in the Harvilchuck patent application referred to above to form the trench, groove or depression 44 in the silicon body. The silicon structure has substantially horizontal surfaces 45 and substantially vertical surfaces 46. The FIG. 4B structure is then formed by depositing an insulating layer 48 by a chemical vapor deposition of a material such as silicon dioxide. The FIG. 4B structure is then put into a reactive ion etching ambient to remove the insulating layer. FIG. 4C shows the result of such a process wherein the insulator is completely removed from the horizontal surfaces. The result is a narrowed dimensioned region of the insulating layer 48 remaining on the vertical surfaces, as shown in FIG. 4C. The FIG. 4E shows the result of a thermal diffusion of an impurity through the narrowed dimensioned region into the silicon body wherein diffused region 50 is shown. Where it is desired to ion implant impurities in the body, it is preferable to implant these impurities through a thin insulating screen layer. This may be accomplished simply by allowing the reactive ion etching to remove the insulator from the horizontal surfaces, except for a thin screen layer 52, as shown in FIG. 4D. The FIG. 4D structure is then placed in an ion implantation apparatus wherein ions of the desired impurity pass through the screen layer 52 to form the ion implanted region 54.

Figure 5A:
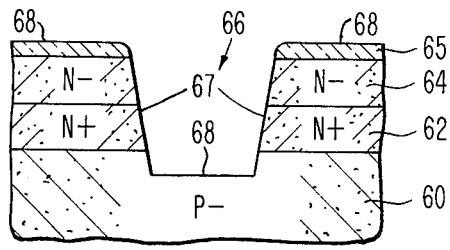
FIGS. 5A through 5F show another embodiment of the present process wherein a substrate contact is formed using polycrystalline silicon.
Figure 5B:
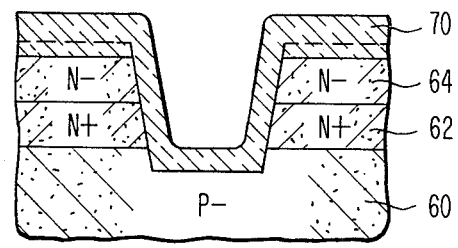
Figure 5C:
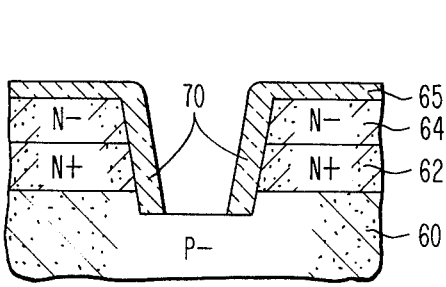
Figure 5D:
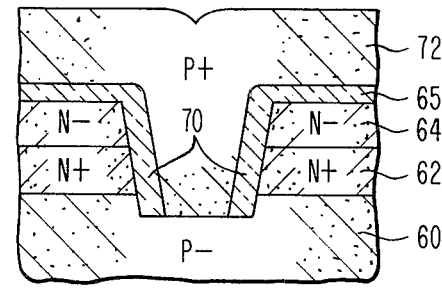
Figure 5E:
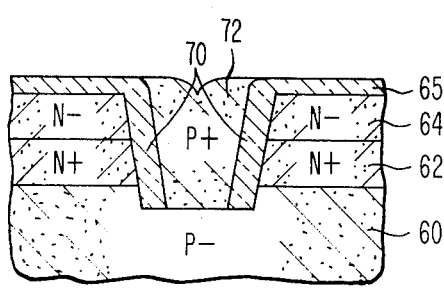
Figure 5F:
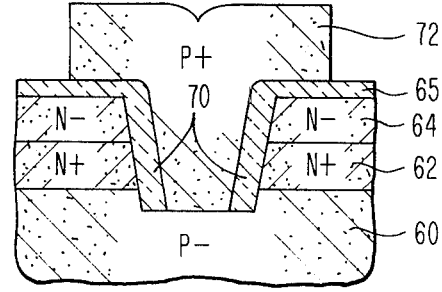

FIGS. 5A through 5F illustrate a fifth embodiment of the present invention which allows the formation of a substrate electrical contact. The fifth embodiment is shown in FIGS. 5A through 5F. A P− substrate of monocrystalline silicon 60 has a blanket subcollector N+ diffusion 62 made therein. An epitaxial N− layer 64 is then grown on top of this substrate. These processes are standard processes in the formation of, for example, NPN bipolar transistors. The substrate 60 is typically a <100> crystallographic orientation silicon wafer having a resistance of the order 1 to 20 ohm-cm. The subcollector diffusion is typically formed using arsenic having a surface concentration of $10^{20}$–$10^{21}$ atoms/cm$^3$ either by capsule diffusion or ion implant technologies. The epitaxial growth process to form layer 64 may be by the conventional techniques, such as the use of SiCl$_4$/H$_2$ or SiH$_4$/H$_2$ mixtures at temperature of about 1000° to 1200° C. During the epitaxial growth the dopant in the N+ layer moves into the epitaxial layer. The thickness of the epitaxial layer for highly dense integrated circuits is less than about 2 microns. A mask, such as thermally grown silicon dioxide layer 65, is formed on the surface of the epitaxial layer 64 and by suitable photolithographic and etching techniques mask openings are formed therein. The silicon reactive ion etching process involving an ambient of Cl$_2$ and Ar is utilized to form the opening 66 as shown in the FIG. 5A. The opening extends through the subcollector diffused region 62 and into the P− substrate 60. The groove, trench, or depression 66 has vertical surfaces 67, and the overall structure has horizontal surfaces 68. An insulating layer is then blanket deposited over the entire surface of the structure to form a layer 70 on both the substantially horizontal surfaces and the substantially vertical surfaces. Reactive ion etching of the layer 70 substantially removes the horizontal layer and provides a narrow dimensioned region on the vertical surfaces, as shown in FIG. 5C. A conductive material which may be heavily P or N doped polycrystalline silicon or any of the several well-known contact metals is used to fill the depression and make contact to the substrate 60. The doping type used for polycrystalline silicon would be the same as the substrate. As in the illustrated example, the substrate 60 is a P− type, therefore, the polycrystalline silicon material 72 would be a P type material. The FIG. 5D structure may then be further processed by back etching using a reactive ion etching process for polycrystalline silicon to result in the FIG. 5E structure where the trench, groove or depression is filled to a planar surface with the polycrystalline silicon 72. The etch conditions for this step would be similar to those used in trench, groove, or depression formation such as Cl$_2$/Ar reactive ion etching. Althernatively, as shown in FIG. 5F, standard photolighography and etching techniques may be used to limit the electrical contact to the region of the electrical contact to the substrate 60.

FIGS. 6A through 6G show a sixth embodiment wherein isolation, such as silicon dioxide, is used to isolate monocrystalline regions in the silicon body from other monocrystalline regions. The silicon body is formed in a manner described as in the fifth embodiment of FIGS. 5A through 5F. Like numbers indicate like structures in this embodiment to that of the fifth embodiment. The silicon body includes a P− substrate 60, an N+ subcollector region 62 and an epitaxial N− layer 64. The epitaxial layer is preferably less than 1.2 micrometers in thickness. An insulating coating, such as silicon dioxide, layer 65 is deposited on the surface of the epitaxial layer 64. The standard photolithography and etching processes are utilized to form mask openings in the silicon dioxide layer 65. The patterns of mask openings define the location of the dielectric isolation trenches to be formed to isolate monocrystalline regions of silicon from one another and to isolate the base-emitter region from the collector reach-through region. Also certain openings in the pattern are wider than other openings in the pattern.

These wider openings in the silicon dioxide mask pattern are the location where it is desired to make electrical contact to the substrate 60. The structure is then placed in a plasma or reactive ion etching ambient for silicon, and the pattern of depressions in the silicon body formed in at least the two different widths which results in regions in the body having substantially a horizontal surface 75 and substantially vertical surfaces 76. The depressions for isolation of monocrystalline regions from one another must go to a depth below the subcollector region 62 while the depression for the dielectric isolation between the base-emitter area and the collector reach-through area only extends partially into the subcollector region 62. To accomplish this difference in depth, it is necessary to form the depressions by separate reactive ion etching steps while masking the other regions from the effect of reactive ion etching as described, for example, in the Bondur et al U.S. Pat. No. 4,139,442. The result of the reactive ion etching step is the FIG. 6A structure.

Figure 6A:
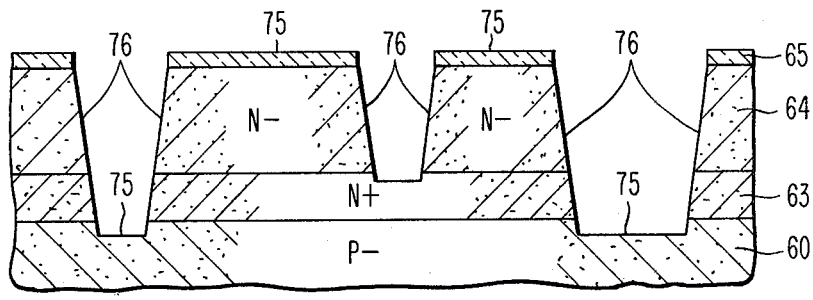
FIGS. 6A through 6G show the further embodiment wherein dielectric isolation and substrate contact are formed in the process for manufacturing a bipolar integrated circuit transistor.
Figure 6B:
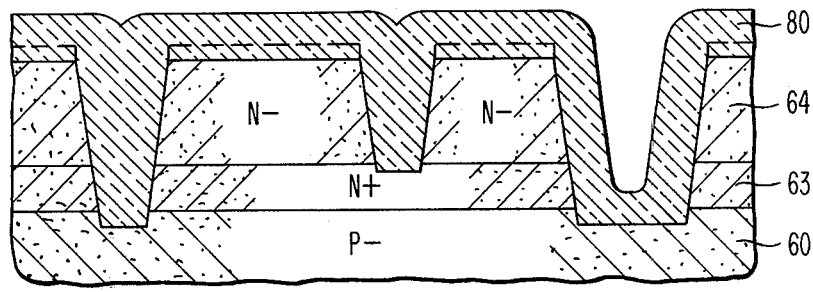
Figure 6C:
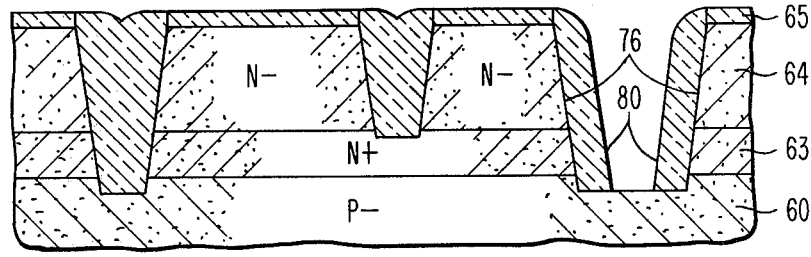
Figure 6D:
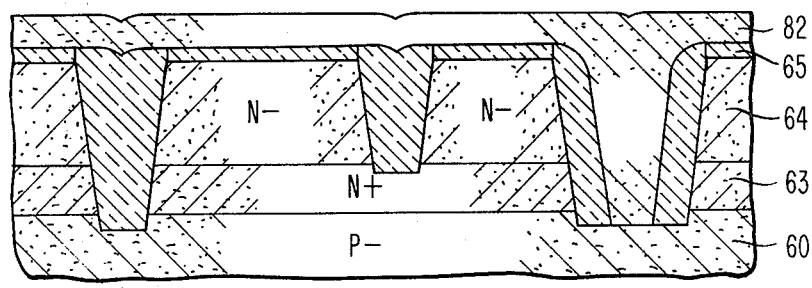
Figure 6E:
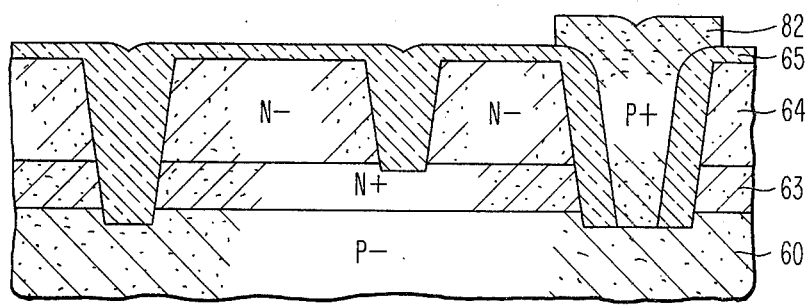

An insulating layer is now deposited onto the structure which fills the narrowest width depressions and forms a layer on both the remaining said substantially horizontal surfaces and said substantially vertical surfaces. This insulating layer is designated as layer 80. The FIG. 6B resulting structure is now placed in a reactive ion etching embodiment for the particular insulating layer which may be, for example, silicon dioxide. The result of the process is to substantially remove said horizontal layer and to provide narrow dimensioned region 80 in the widest of said depressions on the substantially vertical surfaces 76. The bottom of the widest depression is partially bare of any insulator from the reactive ion etching, as shown in FIG. 6C.

Figure 6F:
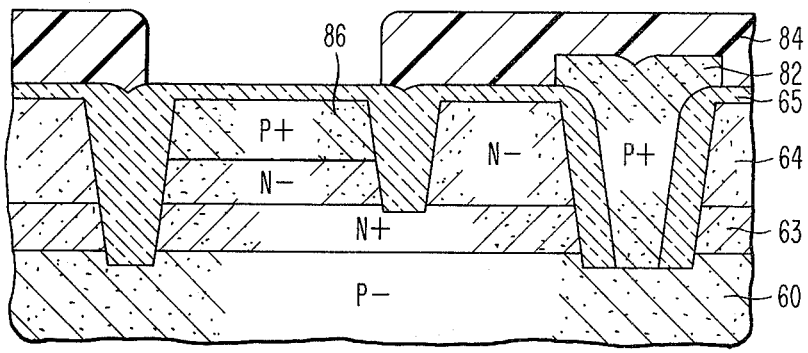
Figure 6G:
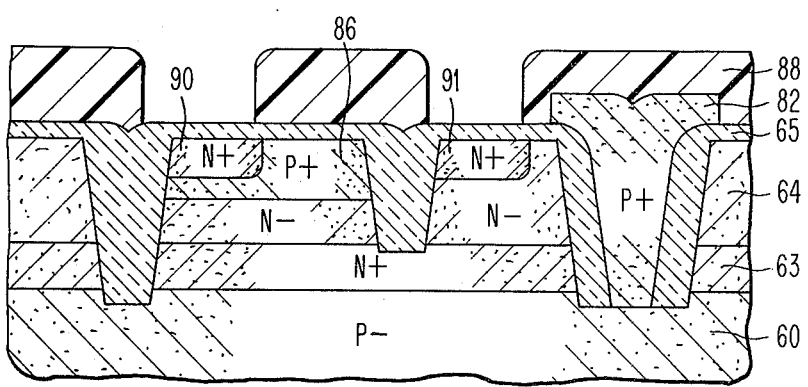

A conductive layer 82 is deposited over the insulating layer and the exposed silicon in the widest of the depressions so as to make electrical contact to the P− layer 60. The electrical contact 82 is etched using standard photolithography and etching techniques to provide the desired pattern of the contact 82 to produce the FIG. 6E structure. FIG. 6F shows the use of a photoresist blockout mask 84 to block out all regions other than the region designated as the base of the NPN transistor being manufactured. The P+ base region 86 is formed by standard ion implantation techniques. Photoresist mask 84 is removed and another photoresist mask 88 is formed by standard photolithography and etching techniques to cover all areas except the areas designated to be the emitter region and the collector reach-through contact region. Ion implantation is used to produce these regions using an N+ source. Ion implantation is caused to form the N+ emitter region 90 in the base region 86 and the collector reach-through contact 91 in the collector reach-through region. Electrical contacts can be made to the elements of the NPN transistor by conventional deposition, lithography and etching techniques.

While the invention has been partially shown and described with reference to the preferred embodiments thereof, it would be understood by those skilled in the art that various changes in form and detail may be made therein without departing from the spirit and scope of the invention.

Having thus described my invention, what I claim is new, and desire to secure by Letters Patent is:

1. A method for forming a narrow dimensioned region on a silicon body comprising:
   providing a silicon body;
   forming on said body regions having substantially a horizontal surface and substantially vertical surface;

said substantially vertical surface is equal to or less than about 5° from the vertical and having a uniformly positive slope wherein the uppermost intersection of said vertical surface with a major horizontal surface does not overhang the lowermost intersection of said vertical surface with a major horizontal surface;

forming a layer on both said substantially horizontal surface and said substantially vertical surface; and reactive ion etching said layer to substantially remove said horizontal layer and to provide said narrow dimensioned region on said silicon body.

2. The method of claim 1 wherein said regions having horizontal and vertical surfaces are formed by reactive ion etching indentations into said silicon body.

3. The method of claims 1 or 2 wherein said layer is an insulator and is completely removed in said narrow dimensioned region and further comprising diffusing an impurity through said narrow dimensioned region into said silicon body.

4. The method of claims 1 or 2 wherein said layer is an insulator and is removed except for a thin screen layer in said narrow dimensioned region and further comprising ion implanting an impurity through said narrow dimensioned region into said silicon body.

5. The method of claims 1 or 2 wherein said layer is an insulator and further comprising forming a conductive layer in said narrow dimensioned region.

6. The method of claim 1 wherein the thickness of said layer is between about 500 to 20,000 Angstroms.

7. The method of claim 2 wherein said layer is an insulator and further comprising depositing an insulator material into said narrow dimensioned region until the region is filled with said material.

8. The method of claim 5 wherein said conductive layer is deposited until said region is filled with conductive layer.

9. A method for forming integrated circuits having a narrow dimensioned region on a silicon body comprising:

providing a silicon body;

forming a first insulating layer on a major surface of said body;

forming on said layer a polycrystalline silicon layer;

forming an opening in said polycrystalline silicon layer by reactive ion etching which results in the structure having substantially a horizontal surface and a substantially vertical surface;

said substantially vertical surface is equal to or less than about 5° from the vertical and having a uniformly positive slope wherein the uppermost intersection of said vertical surface with a major horizontal surface does not overhang the lowermost intersection of said vertical surface with a major horizontal surface;

forming a second insulating layer on both said substantially horizontal surface and said substantially vertical surface; and reactive ion etching said second insulating layer to substantially remove said horizontal layer and to provide said narrow dimensioned region on said silicon body.

10. The method of claim 9 wherein said second insulating layer is completely removed in said narrow dimensioned region and further comprising diffusing an impurity through said narrow dimensioned region into said silicon body.

11. The method of claim 9 wherein said second insulating layer is removed except for a thin screen layer in said narrow dimensioned region and further comprising ion implanting an impurity through said narrow dimensioned region into said silicon body.

12. The method of claim 9 wherein said first insulator layer is silicon dioxide.

13. The method of claim 9 wherein said first insulator layer is a composite of layers of silicon dioxide and silicon nitride.

14. The method of claim 9 wherein said second insulator layer is chemically vapor deposited silicon dioxide.

15. The method of claim 9 further comprising forming a conductive layer in said narrow dimensioned region.

16. The method of claim 15 wherein said conductive layer is deposited until said region is filled with conductive layer.

17. The method of forming a dielectrically isolation integrated circuit comprising:

providing a silicon body;

reactive ion etching a pattern of depressions in said silicon body of at least two different widths which results in regions in said body having substantially a horizontal surface and a substantially vertical surface;

said depressions surround monocrystalline silicon regions in said body;

forming an insulating layer which fills the narrowest width depressions and forms a layer on both the remaining said substantially horizontal surface and said substantially vertical surfaces;

reactive ion etching said layer to substantially remove said horizontal layer and to provide a narrow dimensioned region in the widest of said depressions in which the said silicon body is exposed; and depositing a conductive layer over said insulating layer and the exposed silicon in the said widest of said depressions so as to make electrical contact thereto.

18. The method of claim 17 wherein said integrated circuit is a bipolar integrated circuit, said silicon body contains a buried subcollector, said depressions extend through said subcollector and said electrical contact is made to the substrate of said silicon body.

19. The method of claim 18 wherein the said vertical surfaces are equal to or less than about 5° from the vertical.

* * * * *